United States Patent [19]

Chen et al.

[11] Patent Number: 5,381,125
[45] Date of Patent: Jan. 10, 1995

[54] SPINODALLY DECOMPOSED MAGNETORESISTIVE DEVICES

[75] Inventors: Li-Han Chen, Summit; Sungho Jin, Millington; Thomas H. Tiefel, North Plainfield, all of N.J.

[73] Assignee: AT&T Corp., Murray Hill, N.J.

[21] Appl. No.: 95,124

[22] Filed: Jul. 20, 1993

[51] Int. Cl.⁶ .......................................... H01L 43/00
[52] U.S. Cl. ............................. 338/32 R; 324/207.21
[58] Field of Search .......................... 338/32 R, 32 H; 324/207.21; 148/104, 103

[56] References Cited

U.S. PATENT DOCUMENTS

| | | | |
|---|---|---|---|
| 4,251,293 | 2/1981 | Jin | 148/101 |
| 4,273,593 | 6/1981 | Inoue et al. | 148/103 |
| 4,431,604 | 2/1984 | Sata et al. | 419/23 |
| 4,646,088 | 2/1987 | Inoue | 324/207.21 |
| 4,715,904 | 12/1987 | Iijima et al. | 148/102 |
| 5,206,590 | 4/1993 | Dieny et al. | 324/252 |
| 5,208,716 | 5/1993 | Lazzari | 360/113 |

OTHER PUBLICATIONS

Guy, A. G., *Introduction to Materials Science*, McGraw-Hill Book Company, 1972, pp. 88–90.

Parkin, S. S. P. et al., "Influence of Deposition Temperature on Giant Magnetoresistance of Fe/Cr Multilayers," *Appl. Phys. Lett.*, vol. 62, No. 15, 12 Apr. 1993, pp. 1842–1844.

Butler, E. P. et al., "Structure and Properties of Spinodally Decomposed Cu-Ni-Fe Alloys," *Acta Metallurgica*, vol. 18, Mar. 1970, pp. 347–365.

*Primary Examiner*—Marvin M. Lateef
*Attorney, Agent, or Firm*—David I. Caplan

[57] ABSTRACT

A magnetoresistive medium for sensing magnetic fields is formed by a metallic alloy that contains spinodally decomposed ferromagnetic particles having at least one thickness dimension equal to or less than approximately 0.01 μm.

21 Claims, 1 Drawing Sheet

SPINODALLY DECOMPOSED MAGNETORESISTIVE DEVICES

FIELD OF THE INVENTION

This invention relates to magnetoresistive devices—that is, devices whose electrical resistance changes in accordance with changes in applied magnetic fields-—and more particularly to magnetoresistive sensor devices for reading information from a magnetic, medium—and to methods of making such devices.

BACKGROUND OF THE INVENTION

In prior art, a magnetoresistive sensor device ("magnetoresistive head") typically has comprised a piece of magnetoresistive material through which a constant current I was driven, while it was arranged in physical proximity to a magnetic medium, such as a ribbon or wire, in which bits of information data were stored. Each of the bits typically was manifested by a magnetic orientation or magnetic pole strength of a localized magnetized region of the medium. As magnetic medium was moved such that different regions in succession were in closest proximity to the piece of magnetoresistive material, a change in voltage V across the piece of magnetoresistive material is developed in accordance with the resulting succession of bits that had been stored (and remain stored) in the medium. In this way a magnetoresistive sensor device was formed, with the voltage V measured as a function of time t, thus indicating the spatial sequence of bits stored in the medium. The device thus (nondestructively) can read the information contained in the medium. The device was called a "magnetoresistive transducer" because it thus convened a stream of magnetic information into a stream of electrical resistance (=V/I) information.

For example, U.S. Pat. No. 5,206,590 describes a magnetic sensor comprising a structure including a first and a second thin film layer of ferro-magnetic materials separated by an intermediate thin film layer of a non-magnetic metallic material. The first thin film layer is magnetically soft relative to the second thin film layer. However, although operative, such a structure involves complex and expensive processing of the layers.

SUMMARY OF THE INVENTION

This invention is based on our discovery that significantly enhanced magnetoresistance is exhibited by alloys in which spinodally decomposed solid ferromagnetic particles are embedded, typically as a result of controlled cooling from a high temperature above which homogeneity of the alloy occurs—the particles having at least one dimension that is equal to 0.01 $\mu$m or less, and the particles being "spinodally decomposed". The term "spinodally decomposed" is well known in the art—for example, see E. P. Butler and G. Thomas, "Structure and Properties of Spinodally Decomposed Cu—Ni—Fe Alloys", Acta Metallurgica, Vol. 18, pp. 347–365 (March 1970)—and it refers to particles that have precipitated from a spinodal mole-fraction region of the alloy—viz., a region located between a pair of inflection points (second derivatives equal zero) in the curve of the Gibbs-Helmholtz free energy vs. mole fraction. Unlike a non-spinodal type of particle precipitation, spinodal decomposition results in a spontaneous precipitation of very uniformly sized and uniformly distributed particles, thus maximizing the effective number of particles having desired dimensions and properties. As used herein, the term "significantly enhanced" refers to an increase in the magnetoresistance by a factor of at least three.

More specifically, this invention involves a magnetoresistive device comprising a magnetoresistive medium (a magnetoresistor) for sensing magnetic fields, the magnetoresistor being a metallic alloy medium in which there are embedded spinodally decomposed ferromagnetic particles having at least one (thickness) dimension equal to or less than approximately 0.01 $\mu$m, preferably 0.005 $\mu$m, whereby the magnetoresistance of the alloy medium is enhanced significantly. Advantageously the device further comprises an electrical current source connected to the medium, in order to drive a relatively constant current therethrough, and a voltage sensor connected to the medium, in order to detect changes in the voltage drop across (and, hence in the resistance of) the magnetoresistive medium when the magnetic field applied to the medium changes.

Advantageously also, the composition of the metallic alloy is selected as described below in greater detail in the Detailed Description. In general, the alloy comprises at least one ferromagnetic metal and at least one non-ferromagnetic metal. Finally, magnetic tape reading devices, identification card, reading devices, and access card devices can be fabricated using the magnetoresistive element of this invention.

DETAILED DESCRIPTION

Figure 1:
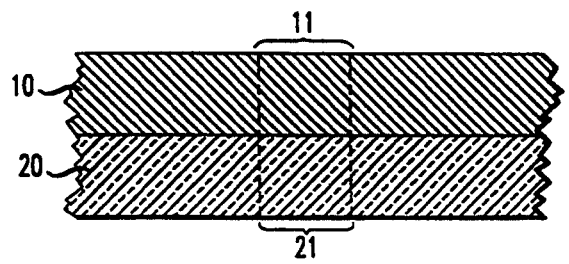
FIG. 1 depicts a cross section of a magnetoresistive alloy body including a magnetoresistive medium in accordance with a specific embodiment of the invention.

Referring now To FIG. 1, a magnetoresistive metallic alloy medium 11 located on a substrate medium 21 is cut from a (larger) magnetoresistive alloy body 10 located on a substrate body 20. The substrate body 20 and, hence the substrate medium 21 are optional. The magnetoresistive alloy medium 11 is in the form of a relatively thin uniform layer (thin uniform film) of a metallic alloy that contains a sufficient concentration of spinodally decomposed (precipitated) ferromagnetic particles, each of the particles having at least one thickness dimension that is approximately equal to or less than 0.01 $\mu$m, so that the magnetoresistance of the magnetoresistive body 10, and hence of the magnetoresistive medium 11, is significantly higher than would be the case in the absence of the spinodally decomposed particles or in the presence of coarser particles. Preferably the above mentioned thickness dimension is less than 0.005 $\mu$m.

Typically the substrate body 20 comprises a nonmagnetic material such as aluminum, molybdenum, stainless steel, quartz, polymer, or silicon, or a remanent magnetic layer having a relatively low Curie point (e.g., less than approximately 300° C.) such as barium-ferrite—the remanent magnetic layer being present as an option to provide and to delete (by heating) a magnetic biasing field applied to the magnetoresistive medium 11 in an array of such magnetoresistive media, as more fully explained below.

Figure 3:
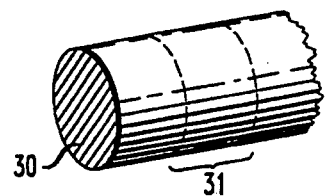
FIG. 3 is a perspective view, partly in cross section, of a magnetoresistive body including a magnetoresistive medium in accordance with another specific embodiment of the invention.
Figure 2:
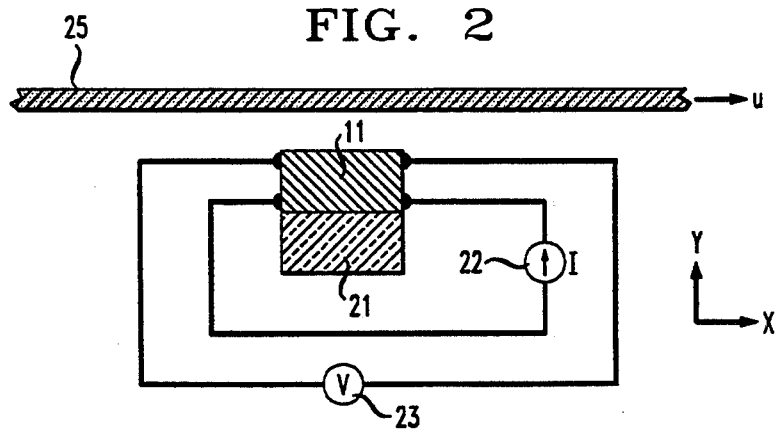
FIG. 2 is a diagram, partly in cross section, of a magnetoresistive device in accordance with another specific embodiment or the invention.

Alternatively, instead of an uniform thin layer-depending on how the magnetoresistive body 10 has been prepared, as described more fully below—the magnetoresistive body 10 can take the form of a nonuniformly thick piece of bulk material or a thick layer (will,out the substrate body 20) which is then cut into pieces of suitable size to serve as the magnetoresistive alloy medium 11 indicated in FIG. 2. As another alternative (FIG. 3), the magnetoresistive alloy medium 31 can be cut from an elongated cylindrically shaped magnetoresistive alloy body 30 and can then serve as the magnetoresistive medium 11 (FIG. 2). In any case, the overall size of the magnetoresistive medium 11 is typically approximately 1 mm×1 mm×1 mm or less, preferably approximately 10 μm×10 μm×10 μm or less, and this medium 11 contains the above-mentioned spinodally decomposed ferromagnetic particles.

As indicated in FIG. 2, the magnetoresistive medium 11, optionally located on the substrate medium 21, is located in proximity to a selectively magnetizable member 25—i.e., a member in which information is stored by virtue of a pattern of magnetization in the x direction, such as a magnetic tape moving with an illustrative instantaneous velocity u in the x direction. Alternatively the member 25 can be a localized magnetized body that moves in the y direction. At any rate, the magnetic field B in which the magnetoresistive medium 11 finds itself thus varies with time depending on the pattern magnetization of the member 25. At the same time, a constant current I is driven through the magnetoresistive medium 11 by a current source 22 connected across this medium. Typically the current I is equal to approximately a milliampere. A voltage sensor 23 is also connected across the medium 11, whereby the voltage V detected by this sensor 23 varies with the magnetic field B, since the resistance of the magnetoresistive medium 11 is given by the expression V/I (and here I is constant). In this way, the value of V as a function of time yields the desired information concerning the magnetic field applied by the magnetizable medium 25 to the magnetoresistive medium 11 as a function of time. Thus the voltage sensor 23 yields the desired information concerning the magnetic fields produced by the medium 25 at the medium 11 and, hence of the pattern of magnetization (i.e., data) stored in the medium 25.

Figure 4:
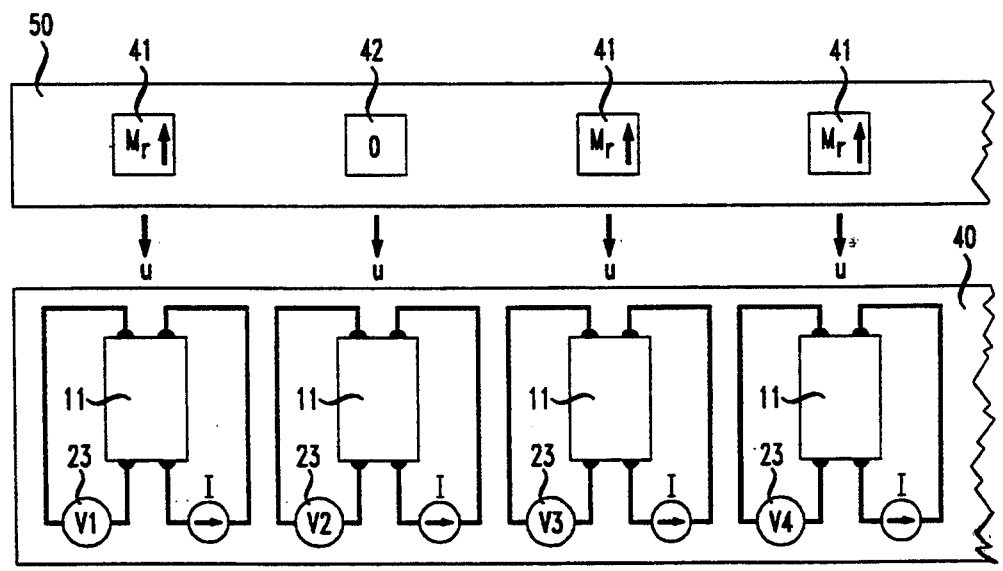
FIG. 4 is a diagram of a magnetoresistive device in accordance with another specific embodiment of the invention.

FIG. 4 shows an array 40 in which an assembly of a multiplicity of magnetoresistive devices is fixed. Each of these magnetoresistive devices includes a separate magnetoresistive metallic alloy medium 11 of the kind described above. An equal multiplicity of magnetizable regions or members 41 or 42 is fixed in a card 50. The magnetizable members 41 are magnetized with a substantial amount of remanent (permanent) magnetization $M_r$; the magnetizable member 42 is magnetized with zero (negligible) remanent magnetization. This can be any number of magnetizable members 41 and 42, respectively. The distance between centers of each nearest neighboring magnetizable member 41 or 42 is advantageously made equal to the distance between centers of corresponding nearest neighboring magnetoresistive media 11. Thus, when the card 50 is displaced toward the (stationery) assembly 40 with the illustrative instantaneous velocity u—while the constant current I is driven through each of the magnetoresistive media 11—then the voltages V1, V2, V3, V4 . . . developed during and after (u=0) the displacement respectively indicate the magnetization $M_r$ or not of each of the corresponding magnetizable members 41 or 42 in the array. Thus, the array 40 serves as a "card reader" in this embodiment of the invention.

Conversely, if the direction of u is reversed—i.e., the array 40 initially is displaced toward the (stationery) card 50—then the same results regarding the voltages V1, V2, V3, V4 . . . are obtained. The card 50 is then ordinarily incorporated in a machine (not shown), such as an "automatic teller [cash] machine". The voltage sensors 23 are then advantageously connected to integrated electronic circuitry (not shown). In such a case, the array 40 together with the circuitry can serve as an access card, credit card, or other form of "smart card". Instead of the permanent magnetizations $M_r$, electromagnetic fields produced by electrical circuitry (not shown) located in the machine can be used.

When the substrate medium 21 is a ferromagnetic or other remanent magnetic material having a relatively low Curie temperature, typically of approximately 300° C. or less—i.e., a magnetic material which, even when it is heated somewhat above its Curie temperature, the spinodal structure of the magnetoresistive medium 11 is not affected—then a read-mostly memory element is formed by the structure comprising the magnetoresistive medium 11, the (magnetic) substrate medium 21, the current source 22, and the voltage sensor 23. Writing of information into this memory element is performed by magnetizing the substrate medium 21 with a magnetic field; reading is performed by sensing the voltage V when the current I is applied; and erasing is performed by directing a laser beam on the substrate medium 21 in order to heat it above its Curie temperature and thereby demagnetize it. Instead of the laser beam, the demagnetizing can be performed by arranging a wire or solenoid i n the neighborhood of the substrate medium 21 and gradually decreasing an AC current through the wire or solenoid, and hence the magnetic field produced by the AC current, as known in the art; re-magnetizing the substrate medium 21 can then be achieved by pulsing a sufficient DC current i through the wire or solenoid.

EXAMPLE I

In order to fabricate the material of the magnetoresistive body 10, a bulk sample alloy containing copper, nickel, and iron is heated to a relatively high temperature, typically approximately 950° C., whereby a single-phase, homogeneous bulk solid solution is formed. This solid solution is quickly cooled, as by quenching it in salt water at room temperature, whereby the resulting bulk metallic alloy solid is the desired magnetoresistive body 10. More specifically, the resulting bulk solid is a metallic alloy of spinodally decomposed copper-poor nickel-iron particles embedded in a matrix of a copper-rich nickel-iron metallic alloy, the particles having all three dimensions (average diameters in three orthogonal directions) less than or equal to approximately 0.003 μm. This bulk solid is then advantageously cut into pieces each of suitable size to serve as the magnetoresistive medium 11 (FIG. 2).

For example, in the case of spinodally decomposed particles in a concentration of approximately 30 percent by volume in conjunction with a magnetic field of approximately 60 kilogauss, the magnetoresistance effect (the relative change in resistivity caused by the magnetic field) was measured to be equal to approximately 7 percent at 4.2K.

EXAMPLE II

Instead of the quenching as in EXAMPLE I, after the heating to typically approximately 950° C., the bulk sample is cooled to an intermediate temperature, typically approximately 600° C. and is maintained at the latter temperature for a prescribed amount of time, typically for several hours. Then the sample is quickly cooled to room temperature, as by quenching in salt water, whereby the spinodally decomposed copper-poor particles have all three diameters in the approximate range of 0.05 $\mu$m to 0.10 $\mu$m. In order to reduce the size of these particles to a desired value—i.e., at least one dimension less than approximately 0.01 $\mu$m, preferably 0.005 $\mu$m—the bulk sample is either mechanically rolled into a ribbon (layer) having a thickness (one dimension) thereby reduced by a factor of at least five, or is extruded to form the cylindrically shaped magnetoresistive body 30 having a diameter (two dimensions) reduced by a factor of at least five. Such rolling or extrusion reduces one dimension or two dimensions, respectively, of the spinodally decomposed particles by a factor of a least five. In this way, it was found that the magnetoresistance effect again in conjunction with a magnetic field of 60 kilogauss was enhanced by a factor of at least eight—e.g., from 0.6 percent to 5.0 percent at room temperature.

In the above Examples I and II, the composition of the bulk sample is advantageously selected as follows: copper in the approximate range of 30-to-80 percentum by weight, preferably 40-to-70 percentum; nickel in the approximate range of 10-to-40 percentum by weight, preferably 15-to-30 percentum; and iron in the approximate range of 5-to-35 percentum by weight, preferably 15-to-30 percentum. In addition, so long as the composition of copper, nickel, and iron in the bulk sample is in the spinodal region, one or more certain other metals can be added, whereby the composition further contains up to approximately 10 percentum by weight in toto of other elements such as V, Cr, Mn, Zn, Zr, Nb, Mo, Al, Ti, Co, Ag, Ta, Hf, W, and Re. Moreover, instead of copper, nickel, and iron, the following other metallic combinations that form spinodally decomposing alloys can be used: Cu—Ni—Co, Al—Ni—Fe, Al—Ni—Co—Fe, Fe—Cr, and Fe—Cr—Co, in accordance with the ranges of compositions recited in the following Table:

| Composition Range of Spinodal Alloys | | Typical Range by weight percent | Preferable Range by weight percent |
|---|---|---|---|
| Cu—Ni—Fe | Cu | 30–80 | 40–70 |
|  | Ni | 10–40 | 15–30 |
|  | Fe | 5–35 | 15–30 |
| Cu—Ni—Co | Cu | 20–60 | 30–50 |
|  | Ni | 10–40 | 15–30 |
|  | Co | 15–60 | 20–50 |
| Al—Ni—Fe | Al | 6–20 | 8–16 |
|  | Ni | 15–40 | 20–30 |
|  | Fe | 40–70 | 50–60 |
| Al—Ni—Co—Fe | Al | 6–20 | 8–16 |
|  | Ni | 15–40 | 20–30 |
|  | Co | 5–40 | 8–30 |
|  | Fe | 30–70 | 40–60 |
| Fe—Cr | Fe | 30–70 | 35–65 |
|  | Cr | 30–70 | 35–65 |
| Fe—Cr—Co | Fe | 20–50 | 25–45 |
|  | Cr | 40–80 | 50–70 |
|  | Co | 5–30 | 8–20 |

Each of these combinations can also contain up to 10 percent by weight in toto of other elements such as V, Cr, Mn, Zn, Zr, Nb, Mo, Al, Ti, Co, Ag, Ta, Hf, W, and Re.

We claim:

1. A magnetoresistive device comprising a magnetoresistor for sensing magnetic fields, the magnetoresistor being a metallic alloy medium in which there are embedded an effective number of spinodally decomposed ferromagnetic particles each having at least one dimension equal to or less than approximately 0.01 $\mu$m, whereby the magnetoresistance of the alloy medium is significantly enhanced.

2. The device of claim 1 in which the particles have at least two dimensions equal to or less than approximately 0.01 $\mu$m.

3. The device of claim 2 in which the alloy medium comprises copper, nickel, and iron.

4. The device of claim 2 in which the alloy medium comprises copper, nickel, and cobalt.

5. The device of claim 2 in which the alloy medium comprises aluminum, iron, and nickel.

6. The device of claim 2 in which the alloy medium comprises iron and chromium.

7. The device of claim 2 in which the alloy medium comprises iron, chromium, and cobalt.

8. The device of claim 2 in which the alloy medium comprises aluminum, nickel, cobalt, and iron.

9. The device of claim 1 in which the alloy medium comprises copper, nickel, and iron.

10. The device of claim 1 in which the alloy medium comprises copper, nickel, and cobalt.

11. The device of claim 1 in which the alloy medium comprises aluminum, iron, and nickel.

12. The device of claim 1 in which the alloy medium comprises iron and chromium.

13. The device of claim 1 in which the alloy medium comprises iron, chromium, and cobalt.

14. The device of claim 1 in which the alloy medium comprises aluminum, nickel, cobalt, and iron.

15. The device of claim 1 in which the alloy medium has first and second perpendicular dimensions in a ratio of at least two.

16. The device of claim 1 in which the dimension is less than approximately 0.005 $\mu$m.

17. The device of claim 1, 2, 15, or 16 further comprising a source of electrical current connected to the medium.

18. The device of claim 17 further comprising a voltage sensor connected to the medium.

19. An array of magnetoresistive devices each in accordance with claim 1, 2, 15, or 16, each of the magnetoresistors in the nearest neighboring devices being located at a prescribed distance from one another.

20. A magnetoresistive device in accordance with claim 18 in which the voltage sensor comprises an integrated circuit.

21. An array of magnetoresistive devices, each in accordance with claim 20, whereby an assembly of such devices is formed, each of the magnetoresistors in the nearest neighboring devices being located at a prescribed distance from one another.

* * * * *